United States Patent
Dohji et al.

(10) Patent No.: US 8,181,072 B2
(45) Date of Patent: May 15, 2012

(54) MEMORY TESTING USING MULTIPLE PROCESSOR UNIT, DMA, AND SIMD INSTRUCTION

(75) Inventors: Hiroshi Dohji, Kanagawa-ken (JP); Hironori Makimura, Kanagawa-ken (JP); Minoru Kida, Kanagawa-ken (JP); Nobuyoshi Tanaka, Tokyo (JP)

(73) Assignee: International Business Machines Corporation, Armonk, NY (US)

( * ) Notice: Subject to any disclaimer, the term of this patent is extended or adjusted under 35 U.S.C. 154(b) by 267 days.

(21) Appl. No.: 12/357,080

(22) Filed: Jan. 21, 2009

(65) Prior Publication Data

US 2009/0187793 A1 Jul. 23, 2009

(30) Foreign Application Priority Data

Jan. 21, 2008 (JP) ................................. 2008-010263

(51) Int. Cl.
G11C 29/00 (2006.01)
(52) U.S. Cl. ........................................ 714/718; 714/807
(58) Field of Classification Search .......... 714/710–711, 714/718–723; 365/200–201
See application file for complete search history.

(56) References Cited

U.S. PATENT DOCUMENTS

| | | | | |
|---|---|---|---|---|
| 4,688,222 A * | 8/1987 | Blum | ............................. | 714/732 |
| 5,274,648 A * | 12/1993 | Eikill et al. | .................... | 714/719 |
| 5,668,815 A * | 9/1997 | Gittinger et al. | .............. | 714/719 |
| 5,668,816 A * | 9/1997 | Douskey et al. | .............. | 714/720 |
| 5,673,388 A * | 9/1997 | Murthi et al. | .................... | 714/42 |
| 5,991,232 A * | 11/1999 | Matsumura et al. | ........ | 365/233.1 |
| 6,170,070 B1 * | 1/2001 | Ju et al. | .......................... | 714/718 |
| 6,381,715 B1 * | 4/2002 | Bauman et al. | ................ | 714/718 |
| 6,708,302 B1 * | 3/2004 | Shibayama et al. | ........... | 714/724 |
| 7,065,688 B1 * | 6/2006 | Moyes et al. | .................. | 714/718 |
| 7,143,321 B1 * | 11/2006 | Everett et al. | .................. | 714/718 |
| 7,194,660 B2 * | 3/2007 | Edrich | ............................. | 714/36 |
| 7,251,744 B1 * | 7/2007 | Housty | ............................. | 714/7 |
| 2004/0006667 A1* | 1/2004 | Bik et al. | ........................ | 711/100 |
| 2008/0082872 A1* | 4/2008 | Nagasaka | ...................... | 714/719 |

FOREIGN PATENT DOCUMENTS

| | | |
|---|---|---|
| JP | 2001-356971 | 12/2001 |
| JP | 2005-268914 | 9/2005 |

\* cited by examiner

*Primary Examiner* — Jeffrey A Gaffin
*Assistant Examiner* — Steve Nguyen
(74) *Attorney, Agent, or Firm* — DeLizio Gilliam, PLLC

(57) ABSTRACT

To provide a method and the like for testing a main memory in a multi processor system, which is capable of reducing a test execution time and accordingly a start-up time as compared with the case where a single processor is used for the test. The present invention provides a method for testing a main memory (MM) in a multi processor system (MPS) including a main processor (MP) and multiple sub processors (SP) each having a DMA transfer mechanism and a local store (LS). The method and the like including: MP allocating a partial memory region (PMA) in MM to each SP; MP requesting each SP to test the allocated PMA; each SP filling LS thereof with initial data in response to receiving the request; each SP transferring the data stored in LS thereof to PMA by using a DMA transfer; each SP transferring the data stored in PMA to LS thereof by a DMA transfer; and SP testing the data in LS; and MP judging a test result on MM by putting together the tests results in response to the completion of all the tests by respective SP.

9 Claims, 7 Drawing Sheets

```
        xor     r6,r6,r6        # LOAD REGISTER r6 WITH 0 (VALUE TO BE FILLED)
        xor     r7,r7,r7        # LOAD REGISTER r7 WITH 0 (INITIAL ADDRESS OF REGION TO BE FILLED)
        li      r8,M/4          # LOAD REGISTER r8 WITH (M/4)
        mtctr   r8              # PLACE CONTENTS OF REGISTER r8 IN REGISTER ctr
0:
        stw     r6,0(r7)        # STORE CONTENTS (4-BYTE 0) OF REGISTER 6 TO ADDRESS POINTED TO
                                  BY REGISTER r7
        addi    r7,r7,4         # ADD 4 TO REGISTER r7
        bdnz    0b              # SUBTRACT 1 FROM CONTENTS OF REGISTER ctr, AND THEN, IF RESULT
                                  IS NOT EQUAL TO 0, BRANCH TO LABEL 0
```

FIG. 3

```
        xor     r6,r6,r6        # LOAD REGISTER r6 WITH 0 (VALUE TO BE FILLED)
        xor     r7,r7,r7        # LOAD REGISTER r7 WITH 0 (INITIAL ADDRESS OF REGION TO BE FILLED)
        li      r8,M/8          # LOAD REGISTER r8 WITH (M/8)
        mtctr   r8              # PLACE CONTENTS OF REGISTER r8 IN REGISTER ctr
0:
        std     r6,0(r7)        # STORE CONTENTS (8-BYTE 0) OF REGISTER r6 TO ADDRESS POINTED
                                  TO BY REGISTER r7
        addi    r7,r7,8         # ADD 8 TO REGISTER r7
        bdnz    0b              # SUBTRACT 1 FROM CONTENTS OF REGISTER ctr, AND THEN,
                                  IF RESULT IS NOT EQUAL TO 0, BRANCH TO LABEL 0
```

FIG. 4

```
        xor     r3,r3,r3      # LOAD REGISTER r3 WITH 0
                                (INITIAL ADDRESS OF REGION TO BE TESTED)
        li      r4(M/8)       # LOAD REGISTER r4 WITH (M/8)
        mtctr   r4            # PLACE CONTENTS OF REGISTER r4 IN REGISTER ctr
0:
        ld      r4,0(r3)      # LOAD REGISTER r4 WITH CONTENTS OF MEMORY POINTED
                                TO BY REGISTER r3
        cmpdi   r4            # PLACE CONTENTS OF REGISTER r4 IN REGISTER ctr
        bne     1f            # IF CONTENTS OF REGISTER r4 IS NOT EQUAL TO 0,
                                BRANCH TO LABEL 1:
        addi    r3,r3,8       # ADD 8 TO REGISTER r3
        bdnz    0b            # SUBTRACT 1 FROM CONTENTS OF REGISTER ctr, AND THEN,
                                IF RESULT IS NOT EQUAL TO 0, BRANCH TO LABEL 0
        xor     r3,r3,r3      # SET RETURN VALUE TO 0
        bk                    # BRANCH TO caller
1:
        li      r3,1          # SET RETURN VALUE TO 1
        bk                    # BRANCH TO caller
```

FIG. 7

|   |       |                |                                                                                           |
|---|-------|----------------|-------------------------------------------------------------------------------------------|
|   | xor   | r3,r3,r3       | # LOAD REGISTER r3 WITH 0 (INITIAL ADDRESS OF REGION TO BE TESTED)                        |
|   | li    | r4(M/16)       | # LOAD REGISTER r4 WITH (M/16)                                                            |
|   | vxor  | v0,v0,v0       | # INITIALIZE SIMD OPERATION REGISTER v0 TO 0                                              |
|   | mtctr | r4             | # PLACE CONTENTS OF REGISTER r4 IN REGISTER ctr                                           |
| 0:|       |                |                                                                                           |
|   | lvx   | v1,0,r3        | # LOAD CONTENTS OF MEMORY POINTED TO BY REGISTER r3 TO REGISTER v1                        |
|   | vaddubm | v0,v0,v1     | # ADD CONTENTS OF SIMD OPERATION REGISTER v1 IN BYTE UNIT TO SIMD OPERATION REGISTER v0   |
|   | addi  | r3,r3,16       | # ADD 1 TO REGISTER r3                                                                    |
|   | bdnz  | 0b             | # SUBTRACT 1 FROM CONTENTS OF REGISTER ctr, AND THEN, IF RESULT IS NOT EQUAL TO 0, BRANCH TO LABEL 0 |
|   | lis   | r3,work_area@h | # LOAD REGISTER r3                                                                        |
|   | ori   | r3,r3,work_area@l | # WITH ADDRESS OF work_area                                                            |
|   | stvx  | v0,0,r3        | # STORE CONTENTS OF SIMD REGISTER v0 IN MEMORY POINTED TO BY REGISTER r3                  |
|   | xor   | r5,r5,r5       | # INITIALIZE REGISTER r5 TO 0                                                             |
|   | li    | r4,16          | # LOAD REGISTER r4 WITH 16                                                                |
|   | mtctr | r4             | # PLACE CONTENTS OF REGISTER r4 IN REGISTER ctr                                           |
| 1:|       |                |                                                                                           |
|   | lbz   | r4,0(r3)       | # LOAD CONTENTS OF MEMORY POINTED TO BY REGISTER r3 TO REGISTER r4                        |
|   | add   | r5,r5,r4       | # ADD CONTENTS OF REGISTER r4 TO REGISTER r5                                              |
|   | addi  | r3,r3,1        | # ADD 1 TO REGISTER r3                                                                    |
|   | bdnz  | 1b             | # SUBTRACT 1 FROM CONTENTS OF REGISTER ctr, AND THEN, IF RESULT IS NOT EQUAL TO 0, BRANCH TO LABEL 1: |
|   | andi  | r5,r5,0xFF     | # COMPARE ONLY LOW-ORDER 1 BYTE OF REGISTER r5 WITH 0,                                    |
|   | cmpwi | r5,0           | #   AND THEN,                                                                             |
|   | bne   | 1f             | # IF IT IS NOT EQUAL TO 0, BRANCH TO LABEL 2:                                             |
| 2:|       |                |                                                                                           |
|   | li    | r3,1           | # SET RETURN VALUE TO 1                                                                   |
|   | bk    |                | # BRANCH TO caller                                                                        |

FIG. 8

MEMORY TESTING USING MULTIPLE PROCESSOR UNIT, DMA, AND SIMD INSTRUCTION

CROSS-REFERENCE TO RELATED APPLICATIONS

The present application claims the benefit under 35 U.S.C. §119 of Japan; Application Serial Number 200810263, filed Jan. 21, 2008 entitled "An Effective Method to Perform Memory Test Using Multi Processor Unit, DMA, and SIMD Instruction," which is incorporated herein by reference.

BACKGROUND OF THE INVENTION

The present invention generally relates to a method for testing a memory. The present invention particularly relates to a method, a computer program and a system which are for efficiently testing a main memory in a multi processor system through parallel processing by use of multiple local stores of respective multiple sub processors; and an access to the local stores.

Under the current computing environment, in the fields of high-performance gaming devices, image-processing servers, image-processing devices for medical application and the like, it is desirable to use a computer system which has a computing capability dramatically improved by use of high-speed video processing, real-time processing and the like. As such a computer system, it is becoming more common to use a multi-processor system provided with multiple processors.

Meanwhile, along with an improvement in computing capacity of a computer system, the trend of increasing the capacity of a main memory thereof (also referred to as system memory, main memory and the like) has become more noticeable than ever. In order to maintain the reliability and quality of a system, it is necessary to test a main memory thereof on various occasions, such as: at a mass-production test of a system or a system board; at times when a system is powered on; and during a maintenance service on a system. However, for a computer system provided with a main memory having a larger capacity, it tends to take an increasingly longer time to perform such tests and to startup the system. Accordingly, the mass productivity in the system production, system usability, service quality for a system and the like are largely affected.

In conventional computer systems including both a single processor and multi-processor systems, a main memory is tested by use of a single processor. However, if a main memory in such a system has a large capacity, it takes too much time for a single processor to perform a test on the entire region of the main memory; thus, such testing is not preferable. Accordingly, especially for configuring a multi-processor system, the possibility that individual processors work together in parallel with each other to test the main memory has been investigated in some cases.

Japanese Patent Application Publication No. 2005-268914 discloses a method for testing a memory in a system provided with multiple processing units. To be more specific, in this method, a memory is divided into multiple memory sections corresponding to the respective processing units, and the memory sections are each tested by the corresponding processing units in parallel. As a result, a time required for a test on the entire memory can be shortened.

However, this method requires, as a premise, a configuration in which the individual processing units are able to access the corresponding memory sections in parallel, more specifically, at the same time and in parallel. Accordingly, this method cannot be adopted in a multi-processor system having a general configuration, such as a configuration in which multiple processors are connected via a shared bus to a main memory.

An object of the present invention is to provide a method and the like for efficiently testing a shared memory in a multi-processor system.

SUMMARY OF THE INVENTION

In order to achieve the above-described object, a first aspect of the present invention is a method for testing a main memory in a multi-processor system provided with a main processor and multiple sub processors each having a direct memory access (DMA) transfer mechanism and a local store. The method includes: (1) the main processor allocating a partial memory region located in a test target memory region of the main memory to each of the multiple sub processors; (2) the main processor requesting each of the multiple sub processors to test the allocated partial memory region; (3) each of the multiple sub processors, in response to receiving the request from the main processor, filling the allocated local store with initial data; (4) each of the multiple sub processors transferring the filled initial data from the local store thereof to the allocated partial memory region by using the DMA transfer mechanism; (5) each of the multiple sub processors transferring data from the partial memory region, which has received the filled initial data, to the local store of the sub processor by using the DMA transfer mechanism; (6) each of the multiple sub processors, after the completion of transferring the data to the local store, testing the local store thereof by checking if the value of the data in the local store which has received the data in the transfer from the partial memory region matches the value of the initial data; and (7) the main processor, in response to the completion of testing the local store for all the multiple sub processors, judging a test result on the test target memory region of the main memory by putting together results of the tests on the respective local stores.

A second aspect of the present invention is a method for testing a main memory in a multi-processor system provided with a main processor and multiple sub processors each having a direct memory access (DMA) transfer mechanism and a local store. The method includes: (1) the main processor allocating a partial memory region located in a test target memory region of the main memory to each of the multiple sub processors; (2) the main processor requesting each of the multiple sub processors to test the allocated partial memory region; (3) each of the multiple sub processors, in response to receiving the request from the main processor, filling the local store with initial data; (4) each of the multiple sub processors transferring the filled initial data from the local store thereof to the allocated partial memory region by using the DMA transfer mechanism; (5) each of the multiple sub processors transferring data from the partial memory region, which has received the filled initial data, to the local store of the sub processor in an upstream transfer by using the DMA transfer mechanism; (6) each of the multiple sub processors, after the completion of transferring the data to the local store, testing the local store thereof by checking if a checksum value matches an expected checksum value calculated in advance from the initial data by sequentially adding piece of the data having been transferred to the local store by a predetermined units to obtain a checksum; (7) the main processor, in response to the completion of testing the local store for all the plurality of sub processors, judging a test result on the test target memory region of the main memory by putting together results of the tests on the respective local stores.

In the above section, the outline of the present invention has been described as a method for testing a main memory in a multi-processor system provided with a main processor and multiple sub processors, which each have a DMA transfer mechanism and a local store and are capable of working in parallel with each other. The present invention can also be recognized as a computer program for causing such a multi-processor system to execute these methods.

The present invention can further be recognized as a multi-processor system having means for executing all the steps involved in these methods.

It should be noted that the above-described outline of the present invention does not include all the essential characteristics of the present invention, and accordingly combinations of these constituents and sub-combinations thereof may also be included in the present invention.

BRIEF DESCRIPTION OF THE DRAWINGS

For a more complete understanding of the present invention and the advantage thereof, reference is now made to the following description taken in conjunction with the accompanying drawings.

FIG. 3 shows an example of program codes to be executed by respective sub processors in the case where an M-byte (M is a multiple of 8) working region in a local store is filled using a 32-bit (4-byte) register.

FIG. 4 shows an example of program codes to be executed by respective sub processors in the case where the same M-byte working region in a local store is filled by using a 64-bit (8-byte) register;

FIG. 7 shows an example of program codes to be executed by the individual sub processors in the case where an M-byte (M is a multiple of 16) working region of the local store is sequentially tested: by loading data using a 64-bit (8-byte) register; and by comparing the value of the data with the value of the initial data; and FIG. 8 shows an example of program codes to be executed by the individual sub processors in the case where a checksum of an M-byte working region (M is a multiple of 16) in the local store is calculated by use of a SIMD Add instruction using a 16-byte SIMD register in order to test the working region.

DETAILED DESCRIPTION OF THE PREFERRED EMBODIMENT(S)

Figure 1:
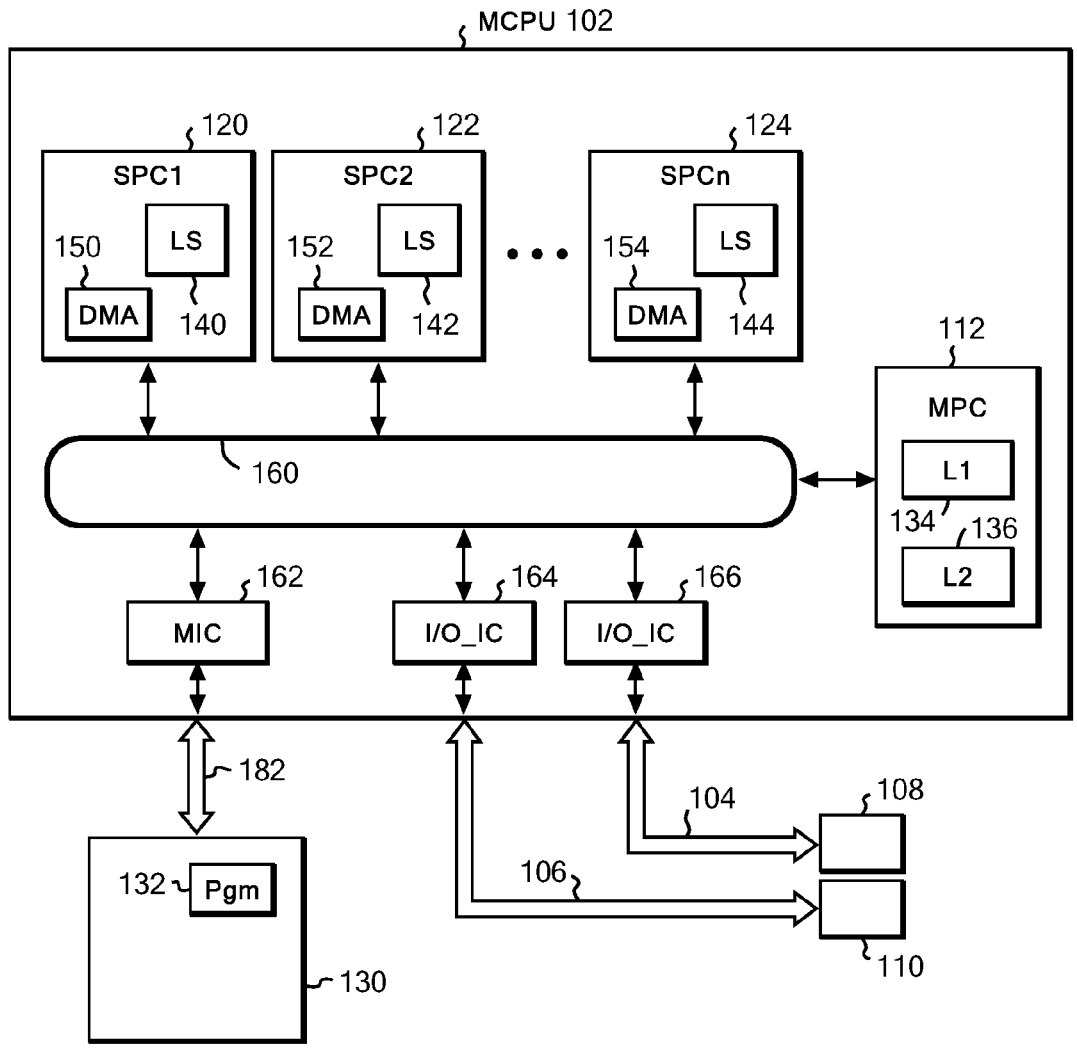
FIG. 1 illustrates a configuration example of a multi processor system for implementing the present invention.

According to the present invention, in the case of testing a main memory in a multi-processor system, it is possible to largely shorten the time required for the test and the start-up time compared to the case where a single processor is used for the test.

In the following section, best modes (hereafter referred to as embodiments) for carrying out the present invention will be described in detail by referring to the attached drawings. Throughout the description of the embodiments, same elements are denoted by the same reference numerals.

Firstly, a description will be given of a configuration of a multi-processor system for carrying out the present invention.

FIG. 1 is a drawing illustrating a configuration example of a multi-processor system for carrying out the present invention. A multi-processor system 100 includes: a multi core processor unit 102 (hereafter referred to as MCPU) composed as a single component (chip); a main memory 130 connected to MCPU 102; and external related components 108 and 110 connected to MCPU 102 via I/O buses 104 and 106, respectively.

MCPU 102, which is a processor unit provided with multiple processor cores each functioning as a processor, includes: a single main processor core (MPC) 112 functioning as a main processor; and an n number (n is an integer number of one or above) of sub processor cores (SPC) SPC1 120, SPC2 112, . . . , SPCn 124.

MPC 112 is a processor capable of executing a computer program 132 stored in a part of the main memory 130, and is optionally provided with cash memories 134 and 136 for loading a part of the computer program 132 in advance.

SPCs 120, 122, . . . , 124, which are respectively provided with local stores 140, 142, . . . , 144, are processors each capable of working in parallel with each other according to a computer program stored in a part of the respective local stores. Different from a so-called cash memory, the local stores 140, 142, . . . , 144 each have an address space independent from the main memory 130.

SPCs 120, 122, . . . , 124 are each further provided with a dynamic memory access (DMA) transfer mechanism, such as DMA controllers 150, 152, . . . , 154, respectively, and thereby capable of performing data transfer between the respective local stores 140, 142, . . . , 144 and the main memory 130. To be more specific, in each of SPCs, the DMA controller is activated so as to perform a downstream transfer from the local store to the main memory 130 and an upstream transfer from the main memory 130 to the local store.

It may be configured that SPCs 120, 122, . . . , 124 are not allowed to directly access and execute the computer program 132 stored in the main memory 130. In this case, MPC 112 loads a computer program for each of SPCs 120, 122, . . . , 124 to a predetermined region of the local store of the SPC as an initiation step so that each of SPCs 120, 122, . . . , 124 can then execute the loaded program.

Thereafter, as a part of the operation based on the computer program, each of the SPCs 120, 122, . . . , 124 can also activate the DMA controller provided therein so as: to perform an upstream transfer of an additional computer program from the main memory to the local store; to execute the transferred computer program; and then to perform an additional operation.

In either case, SPCs 120, 122, . . . , 124 can execute the computer program stored in the respective local stores, and operate in parallel with each other.

MCP 112 and SPCs 120, 122, . . . , 124 are connected with each other via an internal bus 160. The internal bus 160 is further connected to: a memory interface controller 162 for controlling an interface with the main memory 130 connected to MCPU 102 via a memory bus 182; and I/O interface controllers 164 and 166 for controlling an interface with the external related components 110 and 108, respectively.

The main memory 130 may be either a memory entirely composed of a volatile memory device, such as various dynamic random access memories (DRAMs), or such a memory having a part thereof composed of a non-volatile memory device, such as flash memory and read only memory. In the latter case, it is desirable to be configured to store in advance, in the non-volatile memory device: the entire or a part of the computer program for causing the main processor 112 to operate; and the entire or a part of the individual computer programs to be loaded and used for causing the respective SPCs to operate.

The external related components 108 and 110 are various components required for the multi-processor system 100 to literally function as a system. The external related components 108 and 110 may be, for example, graphics controllers, I/O controller bridges for comprehensively controlling interfaces with various I/O devices, or processor units which are identical or equivalent to MCPU 102.

In the case of I/O controller bridges, the external related components 108 and 110 can be further provided in the downstream connection with a high-capacity memory device, such as a hard disk drive (also referred to as HDD, hard disk, hard disk storage, fixed storage, and the like) and DVD, connected via a storage controller (an IDE controller, a SCSI controller, or the like). This high-capacity memory device can be used for primary storage of an operating system required for implementing the present invention, and/or computer programs, such as application software, for implementing the present invention by giving an instruction to a processor and the like in cooperation with the operating system.

After loaded to the main memory 130 and secondarily stored therein, these computer programs are sequentially fetched by the cash memories 134 and 136 in the main processor 112 and executed. These programs may be compressed or divided into multiple parts so as to be stored in multiple media.

The components described as the external related components in the previous section are examples. Accordingly, all the components are not necessarily essential constituents of the multi-processor system 100 of the present invention.

It should be noted that MCPU 102 in the multi-processor system 100 illustrated in FIG. 1 is a processor unit constructed to be a single component (chip). Accordingly, MCPU 102 is provided with MPC 112 and SPCs 120, 122, ..., 124, each of which serves as a processor.

However, needless to say, a processor unit in the multi-processor system for implementing the present invention can be constructed to be a complex of a main processor chip and an n number of sub-processor chips, which are independent components (chips), or any other formation. Hereinafter, a term "main processor" will comprehensively refer to main processor units including a main processor chip, a main processor core, and others, and a term "sub processor" will comprehensively refer to sub processor units including a sub processor chip, a sub processor core, and others.

On the basis of the multi processor system 100 having a configuration described above, embodiments of the present invention will be described in the following section.

Figure 2:
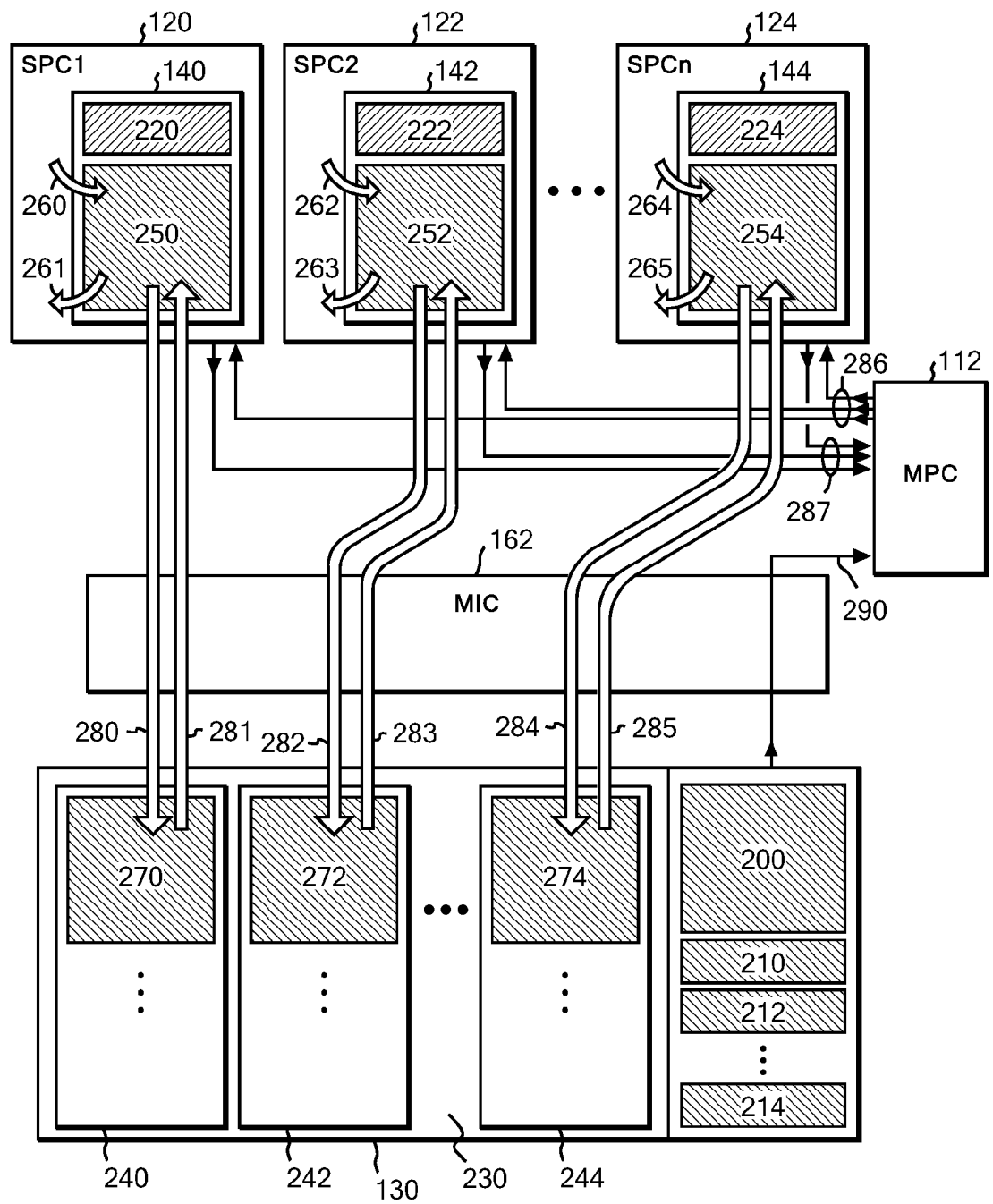
FIG. 2 conceptually illustrates a flow of data in the multi processor system in a first embodiment of the present invention.

At first, a first embodiment of the present invention will be described. FIG. 2 is a schematic drawing illustrating a flow of data in a multi processor system 100 in the first embodiment of the present invention.

After the multi processor system 100 is activated, the main processor 112 fetches and executes a computer program for the main processor 112 stored in a predetermined region 200 in a main memory 130 (arrow 290). The main processor 112 further loads computer programs for the sub processors respectively stored in predetermined regions 210, 212, ..., 214 in a main memory 130 to local store portions 220, 222, ..., 224 in the respective sub processors 120, 122, ..., 124 (arrow 286).

In this state, it will be considered the case of testing the entire region of the main memory 130 except for the regions 200, 210, 212, ..., 214 in which the computer programs for the main processor 112 and for the sub processors 120, 122, ..., 124 are respectively stored (hereafter the region is referred to as "test target memory region" 230).

Firstly, the main processor 112 divides the entire test target memory region 230 in the main memory 130 into the number of the sub processors, n, to obtain an n number of partial memory regions, and allocates the partial memory regions 240, 242, ..., 244 thus obtained to the sub processors so that each of the sub processors is in charge of testing the allocated partial memory region.

It is desirable that the main processor 112 allocate the partial memory regions to the respective sub processors such that processing times of the tests by the respective sub processors will be as equal as possible. For example, in the case where the processing speeds of the respective sub processors are the same, it is desirable that n partial memory regions have an equal size.

The main processor may perform the allocation either on the basis of dynamic judgment the main processor makes once being activated or on the basis of contents statically incorporated in advance into the computer program for the main processor according to the system structure and experimental data.

After allocating the partial memory regions to the respective sub processors, the main processor 112 transmits information regarding a range of the allocated partial memory region to each of the sub processors, and requests each of the sub processors to test the allocated partial memory region (arrow 286).

Next, after receiving the request to test the allocated memory region, the sub processors 120, 121, ..., 124 each executes the program loaded to the local store portion thereof so that a working region, denoted by 250, 252, ..., 254, in the local store is filled ("fill" refers to an operation to fill with a predetermined value) with initial data (arrows 260, 262, ..., 264). When the entire working region is filled with a value "0," as one form of the fill operations, the working region is simply cleared.

Regarding the working regions, it is desirable to make each of them as large as possible. In practical application, it is desirable that the working regions be the entire region available, which does not include the local store portions 220, 222, ..., 224, in the respective local stores.

For the fill operation of the individual working regions, a store instruction provided to each of the sub processors can be employed. In such a case, the fill operation can be more efficiently completed when a store instruction using a register with a longer bit length is employed.

In the following section, efficiencies in the fill operation are compared between the cases of employing a store instruction using a register with a 32-bit length and a 64-bit length.

FIG. 3 shows an example of program codes executed by each of the sub processors in the case where a working region having a size of M-bytes (M is a multiple of 8) in the local store is filled by use of a 32-bit (4-byte) register. Meanwhile, FIG. 4 is an example of program codes executed by each of the sub processors in the case where a working region having a size of M-bytes as well in the local store is filled by use of a 64-bit (8-byte) register.

In the comparison between these cases, the latter case has half the number of loops and approximately half the number of the instructions to be executed, and thereby approximately half of the processing time.

The individual sub processors can be provided with a mechanism for executing single instruction multiple data (SIMD) arithmetic instructions. SIMD allows an arithmetic device installed in a processor to simultaneously process multiple data sets with one instruction.

The working region can be filled with initial data by use of a SIMD store instruction, which is one of the SIMD arithmetic instructions. In this case, the entire working region can be filled faster than in the case where the working region is filled as well by use of a regular store instruction.

For example, in the case where a regular store instruction is executed by use of a 32-bit (4-byte) register, it is only possible to fill a region with 4-bytes in a single step. On the other hand, in the case where a SIMD store instruction is executed by use of a 128-bit (16-byte) SIMD register, it is possible to fill the region with 16-bytes in a single step; thus, a time required for the fill operation can be shortened to approximately ¼.

After filling the working region of the local store with the initial data, each of the sub processors activates the DMA controller so that the initial data filled in the working region of the local store is transferred to a region located in the partial memory region allocated to the sub processor in the main memory in a DMA downstream transfer (arrows 280, 282, ..., 284). The region located in the partial memory region (hereafter, referred to as "transfer unit region" 270, 272, ..., 284, for convenience) has a size same as that of the working region of the local store.

In general, the test target memory region 230 in the main memory has an enormous size. Accordingly, the partial memory regions 240, 242, ..., 244, which have been prepared by dividing the test target memory region 230 to be allocated to an n number of respective sub processors, are still significantly larger than the corresponding working regions 250, 252, ..., 254 in the local stores. Accordingly, in order to fill the entire region of each of the memory regions 240, 242, ..., 244, it is necessary to repeatedly perform the DMA downstream transfer while sequentially shifting the positions of the transfer unit regions 270, 272, ..., 274, which have been the transfer destinations of the DMA downstream transfer. However, it is only necessary to fill the working regions 250, 252, ..., 254 in the local stores with initial data once at the beginning.

As described above, in a single sub processor, the initial data stored in the working region of the local store is repeatedly transferred in DMA downstream transfer so as to fill the partial memory region, which is allocated to the sub processor, located in the main memory (arrow 280).

Likewise, in each of other sub processors, the initial data stored in the working region of the local store is repeatedly transferred in DMA downstream transfer so as to fill the partial memory region, which is allocated to the sub processor, located in the main memory (arrows 282, ..., 284).

In the case where MCPU 102 and the main memory 130 are connected with each other via a single memory bus 182, the bottleneck in DMA downstream transfer in each of the sub processors would be the memory bus 182. To be more specific, the sub processors cannot perform DMA downstream transfers at the same time and in parallel, and accordingly have to perform it sequentially and continuously. Accordingly, in a DMA downstream transfer, there would be no advantage of having multiple sub processors capable of parallel processing.

However, a DMA transfer is to transfer data from a local store to the main memory 130 without involving control by an instruction word, such as a store instruction by the sub processor, and thereby, in some cases, capable of performing burst mode DMA and the like for transferring all data at once.

Accordingly, a certain amount of data can be processed much faster than that in the case where the sub processors sequentially store the same amount of data to the main memory according to a store instruction and the like.

To be more specific, even if the sub processors cannot perform DMA downstream transfers from the local stores to the main memory in parallel, the sub processors can perform the fill operation of the respective local stores in parallel. Accordingly, the overall processing time can be largely reduced.

After the entire region of the partial memory regions is filled with the initial data in the DMA downstream transfers, the sub processors each activates the DMA controller thereof so as to transfer data regarding a certain transfer unit region in the partial memory region in a DMA upstream transfer (arrows 281, 283, ..., 285).

Once the upstream transfer is completed, the sub processors each test (also referred to as memory test and memory check) the respective working regions 250, 252, ..., 254 in the local store (arrows 261, 263, ..., 265).

In this test, each of the sub processors loads (reads) data stored in an address of the working region, and then checks whether or not the value of the loaded data is identical with the value of the initial data having been filled in the address at the beginning. If it is confirmed that all the values of the loaded data in all the addresses of the working region correspond with the value of the initial data, it is determined that a test on this transfer unit region of the main memory has been passed.

As described above, in a single sub processor, the DMA upstream transfer to the local store and the test at the local store are sequentially repeated while shifting the transfer unit region within the partial memory region so that the entire region of the partial memory region can be completely tested at the end.

Likewise, in each of other sub processors, the DMA controller is activated so that data regarding a certain transfer unit region in the allocated partial memory region can be transferred to the working region of the local store in the DMA upstream transfer. Once the upstream transfer is completed, the working region of the local store is tested (also referred to as memory test and memory check). While sequentially shifting the transfer unit region, the upstream transfer and the test are repeated. At the end, the entire region of the partial memory region can be completely tested.

It should be noted that, although a single DMA upstream transfer is performed based on a unit defined by the transfer unit region having an equal size as the working region of the local store, it is also possible to perform a DMA upstream transfer based on a unit of half of the size.

To be more specific, while the working regions in the respective local stores are each divided into two regions, an upper half (upper address) and a lower half (lower address), the transfer unit regions in the partial memory regions are each divided into two regions corresponding the upper and lower regions. At first, a DMA upstream transfer is performed from the upper half of the transfer unit region to the upper half of the working region of the local store. After the completion of the upstream transfer, the sub processors each test the upper half of the working region of the corresponding local store.

The DMA transfer operation can be performed independently of the test operations of the sub processors. Accordingly, the DMA upstream transfer from the lower half of the transfer unit region to the lower half of the working region of the local store can be initiated regardless of whether or not the test on the upper half of the working region of the local store is completed.

After the DMA upstream transfer from the lower half of the transfer unit region, if the test on the upper region of the working region of the local store has been completed, the sub processors then each test the lower half of the working region of the respective local store.

At the same time, regardless of whether or not the test on the lower half of the working region of the local store is completed, the transfer unit region is shifted, and then a DMA upstream transfer can be performed from the upper half of this shifted transfer unit region to the upper half of the working region of the local store.

By performing the DMA upstream transfer and the test on the working region of the local store through pipeline processing as described above, a time required for the test on the working region of the local store is incorporated into a time required for the DMA upstream transfer operation. Thus, it is possible to further shorten a total time required for testing the main memory.

After completing the test on the entire region of the allocated partial memory region, each of the sub processors reports the main processor 112 on a result of the tests (whether or not all the regions have passed the respective test, which address has failed the test, and the like) and the completion of the tests (arrow 287).

Upon receiving the reports on the results of all tests from the sub processors, the main processor 112 puts together all the results to determine the result of a test on the entire region of the test target memory region.

Figure 5:
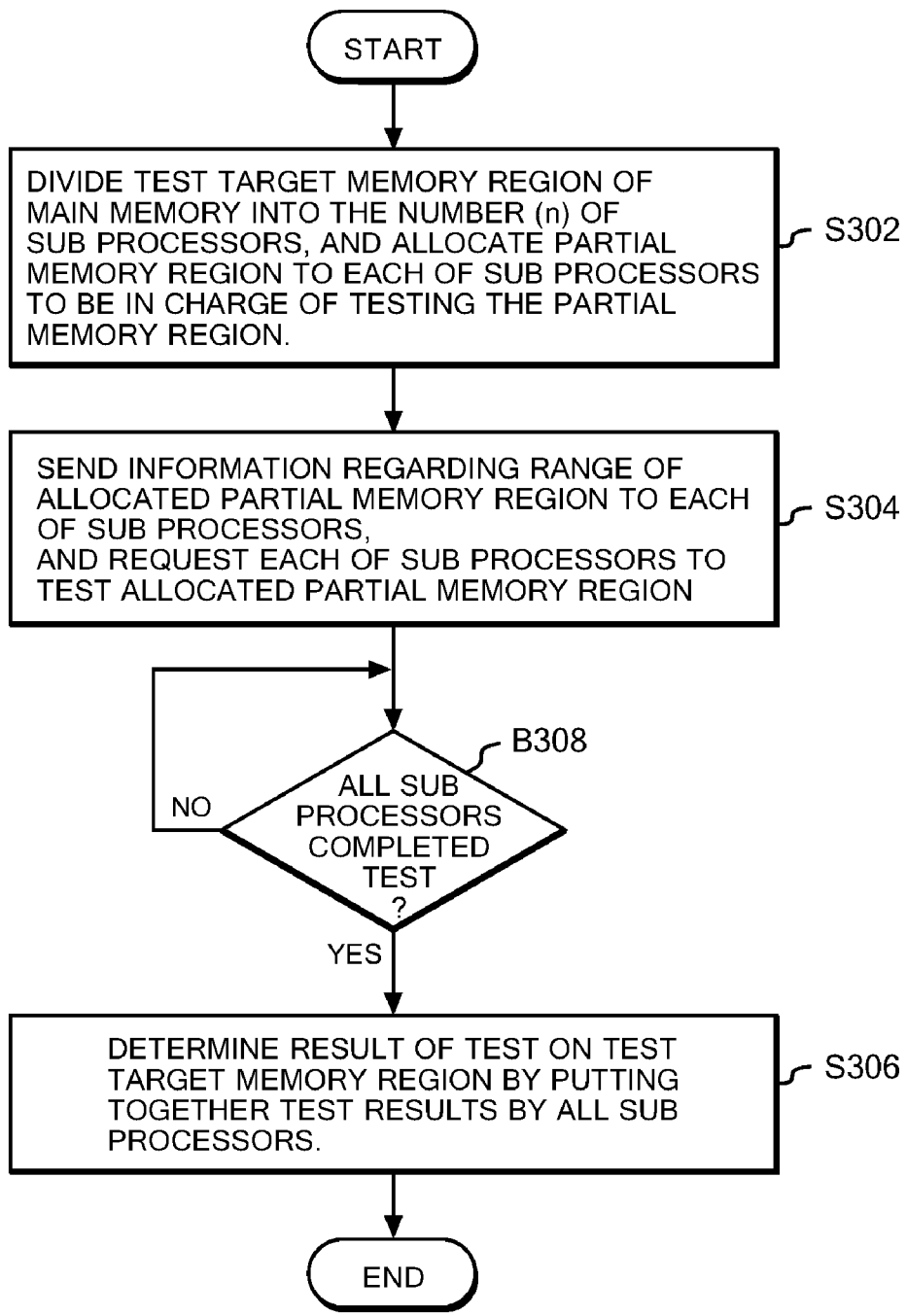
FIG. 5 illustrates a flow of a comprehensive processing procedure from a view of a main processor according to the first embodiment of the present invention.
Figure 6:
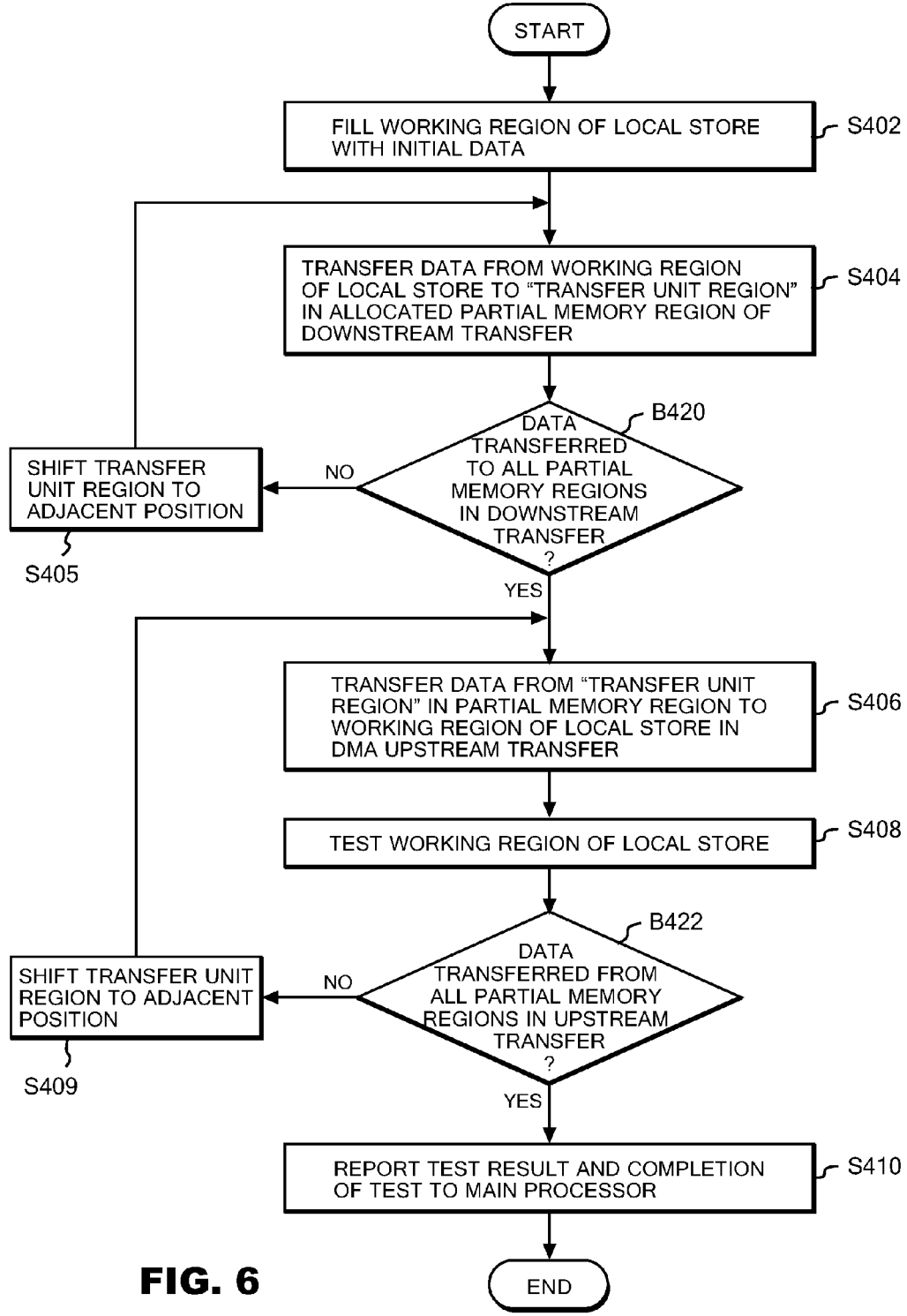
FIG. 6 illustrates a flow of a processing producer in the respective sub processors according to the first embodiment of the present invention.

The first embodiment described above can be identified as a processing procedure related to the computer programs respectively performed by the main processor and the sub processors. FIG. 5 is a drawing illustrating a flow of the comprehensive processing procedure from a view of the main processor of the first embodiment of the present invention. Meanwhile, FIG. 6 is a drawing illustrating a flow of the processing procedure in the individual sub processor of the first embodiment of the present invention.

In the operation of the main processor, at first, in step S302 in FIG. 5, the main processor divides the entire test target memory region of the main memory into the number of the sub processors, n, to obtain an n number of partial memory regions, and then assigns the partial memory regions to the sub processors so that each of the sub processors is in charge of testing the allocated partial memory region.

Next, in step S304, the main processor transmits information regarding a range of the allocated partial memory regions to each of the sub processors, and requests each of the sub processors to test the allocated partial memory region.

Thereafter, the sub processors each initiate an operation upon receiving the request for the test. In this process, not directly involved in the test, the main processor in step B308 goes on standby to receive a report on a test result from each of the sub processors.

Once receiving a report on a test result from each of the sub processors, the main processor judges that all the sub processors completed the test. Then, in step S306, the main processor puts together all the test results and determines the result of a test on the entire region of the test target memory region.

In the operation of the individual sub processors, at first, in step S402 in FIG. 6, having received a request from the main processor to test the partial memory region, the sub processor fills the working region of the local store thereof with initial data.

Next, in step S404, the sub processor activates the DMA controller provided thereto, and performs a DMA downstream transfer for transferring the initial data filled to the working region of the local store to a "transfer unit region." The transfer unit region is located in the allocated partial memory region of the main memory, and has an equal size as that of the working region of the local store.

In the case where the size of the individual partial memory regions is much larger than that of the local store, this downstream transfer is repeatedly performed from the same working region of the local store to the transfer unit region while the position of the transfer unit region is sequentially shifted (step S405) until the entire region of the individual partial region is filled (Yes in step B420).

In the DMA downstream transfer, after the entire region of the individual partial memory region is filled with initial data, the sub processor then in step S406 activates the DMA controller so as to transfer data regarding a certain transfer unit region in the partial memory region to the working region of the corresponding local store in a DMA upstream transfer.

Subsequently, in step S408, upon completing a single upstream transfer, the sub processor tests the working region of the local store.

The upstream transfer and the test on the working region of the local store are performed repeatedly while sequentially shifting the position of the transfer unit region, which is the transfer source (step S409), until the upstream transfer is performed from all the partial memory regions (Yes in step B422).

Lastly, after testing the entire region of the assigned partial memory region, the sub processor reports the main processor on a result of the tests (whether or not the test on the entire region has been passed, which address has failed, and the like) and the completion of the tests.

As described above, the first embodiment of the present invention is not to perform the fill operation and the tests directly on the main memory but to perform the fill operation and the tests by use of the local stores of the respective sub processors while performing high-speed DMA transfers between the individual local stores and the main memory. Accordingly, by implementing this method, it is possible to effectively take advantage of employing the multi processor system capable of parallel processing and high-speed access to local stores. Hence, a time required for a test on the main memory can be greatly reduced.

In the following section, a second embodiment of the present invention will be described.

In the test on the working region of the local store according to the above-described first embodiment, each of the sub processors loads (reads) data stored in an addresses in the working region, and then confirms whether or not the value of the loaded data is identical with the value of the initial data having been filled in the address at the beginning.

In the second embodiment, instead of the process described above for a test of the working region of the individual local stores, data addition (namely, calculation of a checksum) is performed in the entire region of the working region of the local store so that the test can be performed at a higher speed.

To be more specific, each of the sub processors fills initial data to the working region of the local store thereof, and repeatedly performs a DMA downstream transfer from the working region to a certain transfer unit region in the allocated partial memory region of the main memory so as to fill the entire region of the partial memory region with initial data. Thereafter, each of the sub processors transfers data regarding a certain transfer unit region in the partial memory region to the working region of the respective local stores in a DMA upstream transfer. Up to this point in the process, the second embodiment of the present invention is same as the first embodiment.

If a checksum value of the working region of the local store (for example, 1-byte value) is equal to an expected checksum value calculated in advance, it is judged that normal read and write operations are being carried out in the entire region of the working region of this local store. Accordingly, it is judged that the transfer unit region, which is the transfer source of the DMA upstream transfer to this working region, in the partial memory region is also passed the test.

As described above, in a single sub processor, the DMA upstream transfer to the local store and the test based on a checksum of the local store are repeatedly performed while shifting a transfer unit region in the partial memory region so that the entire region of the partial memory region can be completely tested.

Likewise, in each of other sub processors, the DMA controller is activated so that data regarding a certain transfer unit region in the allocated partial memory region is transferred to the working region of the local store in a DMA upstream transfer. On the completion of the upstream transfer, a test based on checksum is performed on the working region of the local store. The upstream transfer and the test are repeatedly performed while sequentially shifting the position of the transfer unit region so that the entire region of the partial memory region can be completely tested.

After completing the test on the entire region of the allocated partial memory region, each of the sub processors reports the main processor on a result of the tests (whether or not a test on the entire region has been passed, whether any region has failed, and the like).

In the second embodiment, the individual sub processors can also be provided with a mechanism for executing SIMD arithmetic instructions.

In the case of testing the working region by using checksum information, a SIMD Add instruction, which is one of the SIMD arithmetic instructions, can be used. In such a case, it is possible to obtain a checksum of the entire working region at a higher speed than in the case where a regular add operation instruction is used to obtain checksum information.

In a SIMD Add instruction based on a SIMD register having an S-byte length, an add operation on S-byte data in one-byte units can be performed in a single step. Accordingly, it is possible to obtain checksum information in a shorter period of time (theoretically, 1/S of the time period) compared to the case of using an add operation instruction which is a regular fixed-point arithmetic instruction.

For example, in a SIMD Add instruction using two 128-bit (16-byte) SIMD registers, data of a certain byte in the 16-bytes of a first SIMD register and data of a corresponding byte of a second SIMD register are added together. This addition is performed for each byte of the 16-bytes at the same time and in parallel. Once final 16-bytes data is obtained after the SIMD Add instruction on the 16-bytes in the entire working region, an add operation is performed on the 16-bytes of the final 16-byte data byte by byte so that a checksum of 1-byte can be obtained.

In the following section, test efficiencies are compared between the method for sequentially testing the working region of the local store on the basis of the first embodiment and the method for testing the working region of the local store by calculating a checksum by use of a SIMD Add instruction and the like on the basis of the second embodiment.

FIG. 7 shows an example of program codes to be executed by the respective sub processors in the case where an M-byte (M is a multiple of 16) working region of the local store is sequentially tested: by loading data using a 64-bit (8-byte) register; and by comparing the value of the data with the value of the initial data. Meanwhile, FIG. 8 shows an example of program codes to be executed by the individual sub processors in the case where a checksum of an M-byte working region (M is a multiple of 16) in the local store is calculated by use of a SIMD Add instruction using a 16-byte SIMD register in order to test the working region.

In the comparison between these two cases, the number of processing of a comparison instruction is smaller in the latter case illustrated in FIG. 8. Accordingly, it is indicated that there is less chance of the pipeline of the sub processors being stalled, and accordingly the processing time can be shortened. Furthermore, while the number of the loop of the program codes is M/8 in the case shown in FIG. 7, the number in the case shown in FIG. 8 is M/16, which is half of the number of the loop in the case in FIG. 7. Accordingly, in the case shown in FIG. 8, the number of processing steps is reduced to approximately half of that in the case in FIG. 7; accordingly, the processing time can be largely reduced.

The total number of the program code steps in the case where a test is passed in a working region is:

$$5\times(M/8)+5$$

in the case shown in FIG. 7; and $$4+4\times(M/16)+3+3+(4\times16)+5=(M/4)+79$$

in the case shown in FIG. 8. Accordingly, if the size M of the working region is sufficiently large, the ratio of the number of steps between these cases converges to:

$$\{M/4\}\div\{5\times(M/8)\}=2/5.$$

Hence, in the case shown in FIG. 8, processing can be completed in the number of steps which is approximately 2/5 of that of the case shown in FIG. 7. Accordingly, the efficiency (speed) of the individual sub processors performing a test on the working region of the respective local stores can be approximately 2.5 times higher.

As described above, in the configuration of the second embodiment, the efficiency of the test on the working region of the local store is increased by obtaining checksums in response to the SIMD arithmetic instruction while multiple sub processors are configured to perform the fill and test operations on the working region of the respective local stores in parallel. Accordingly, under the condition that an n number of sub processors work in parallel, the efficiency (speed) of the test can be increased by more than n times in this embodiment while it can be only increased by less than n times at most in the conventional method.

Table 1 shows processing times actually obtained in cases where a 256 MB test target memory region of the main memory in the multi processor system illustrated in FIG. 1 was tested with various number of sub processors configured to perform parallel processing in the system. The size of the local store provided to each of the sub processors is 256 KB.

TABLE 1

| Processing | Processing time (mSec) |
|---|---|
| Test is performed by main processor without using SIMD operation (conventional style) | 442 |
| Test is performed by one sub processor calculating checksum by using SIMD operation | 205 |
| Test is performed by two sub processors calculating checksum by using SIMD operation | 106 |
| Test is performed by four sub processors calculating checksum by using SIMD operation | 53 |
| Test is performed by eight sub processors calculating checksum by using SIMD operation | 32 |

First, when the entire region of the test target memory region of the main memory is tested without using any sub processor and only with the main processor by using no SIMD arithmetic instruction, the processing time is 442 mSec. This case is equivalent to a conventional data processing method which does not employ the method according to the present invention.

Next, when the same test is performed with only one sub processor and by using the SIMD arithmetic instruction, the processing time is 205 mSec, which is less than half length of the previous case. It is clearly shown that there is an effect of only using SIMD arithmetic instruction.

Consequently, when the test is performed with 2, 4, and 8 sub processors by using the SIMD arithmetic instruction of the sub processors, the processing time is 106 mSec, 53 mSec, and 32 mSec, respectively. As clearly shown by the processing time required in the case of using 8 sub processors, the processing time was shortened by approximately 14 times, which is more than the number of sub processors configured to work in parallel, compared to the case where the method according to the present invention is not adopted.

In the above-described example, data processing time was actually measured for a 256-MB test target memory region of the main memory. However, it is not very rare in recent years that a system is provided with a much larger main memory (for example, approximately 4 GB or larger). Accordingly, it is expected that the contribution of the method and the like according to the present invention to an increase in speed of a test on a main memory will be increasingly significant.

In the previous section, processing procedures based on the first and second embodiments of the present study have been described. These processing procedures are stored in a part outside of the test target memory region of the main memory, and computer programs stored in a part outside of the working region of the local store in the individual sub processors can cause the main processor and/or individual sub processors to execute these processing procedures. Accordingly, the present invention can be recognized as a computer program for causing the multi processor system 100 to execute these processing procedures.

Furthermore, these processing can be executed by a combination of several functional blocks provided to the multi processor system. Accordingly, those skilled in the art of the technical field of the present invention can recognize the present invention as a multi processor system including multiple measures (specifically, functional blocks) capable of executing the processing procedures.

In the above section, embodiments been described. It is possible to further implement some embodiments in other different modes; thus, the above-described embodiments are not intended to limit the invention according to the scope of claims. Hence, the above-described embodiments can be modified and improved in various ways. Such modified and improved embodiments will also be included in the technical scope of the claims. In addition, it should be noted that all combination of the characteristics having been described in the above embodiments are not necessarily essential for means of the invention for solving the problems.

The invention claimed is:

1. A method for testing a main memory in a multi processor system including a main processor and a plurality of sub processors each having a DMA transfer mechanism and a local store, the method comprising:
the main processor allocating a partial memory region in a test target memory region of the main memory to each of the plurality of sub processors;
the main processor requesting each of the plurality of sub processors to test the allocated partial memory region;
each of the plurality of sub processors, in response to receiving the request from the main processor, filling the local store thereof with initial data;
each of the plurality of sub processors transferring the filled initial data from the local store thereof to the allocated partial memory region by using the DMA transfer mechanism;
each of the plurality of sub processors transferring data from the partial memory region, which has received the filled initial data, to the local store of the sub processor by using the DMA transfer mechanism;
each of the plurality of sub processors, after the completion of transferring the data to the local store, testing the local store thereof by checking if the value of the data in the local store which has received the data in the transfer from the partial memory region matches the value of the initial data; and
the main processor, in response to the completion of testing the local store for all the plurality of sub processors, judging a test result on the test target memory region of the main memory by putting together results of the tests on the respective local stores
wherein each of the plurality of sub processors testing the local store thereof includes each of the plurality of sub processors checking if a checksum value matches an expected checksum value calculated in advance from the initial data, by sequentially adding pieces of the data having been transferred to the local store by a predetermined unit to obtain a checksum; and
wherein each of the plurality of sub processors includes means for executing an M-byte SIMD Add instruction, and calculating a checksum includes each of the plurality of sub processors:
adding a first M-byte data and a second M-byte data byte by byte by using the SIMD Add instruction;
calculating a final M-byte addition data by repeating the adding through the entire region of the local store; and
adding each byte of the final M-byte addition data.

2. The method according to claim 1, wherein each of the plurality of sub processors includes means for executing an M-byte SIMD Store instruction, and filling the local store with the initial data includes each of the plurality of sub processors sequentially storing M-byte initial pattern data for every M-bytes throughout the entire local store by using the SIMD Store instruction.

3. The method according to claim 1, wherein the partial memory regions are larger than the respective local stores, and wherein transferring the filled initial data from the local store includes:
each of the plurality of sub processors transferring the filled initial data as a first downstream transfer by using the DMA transfer mechanism from the local store to a transfer destination in a first transfer unit region, the first transfer unit region being a part of the partial memory region and which has the same size as the local store; and
after the first downstream transfer, shifting the transfer destination from the first transfer unit region to a subsequent transfer unit region which has not been subjected to the transferring of the filled initial data, and then transferring the filled initial data from the local store to the subsequent transfer unit region as a subsequent downstream transfer by using the DMA transfer mechanism.

4. The method according to claim 3, wherein transferring data from the partial memory region includes each of the plurality of sub processors:
transferring data as a first half-size upstream transfer by using the DMA transfer mechanism to a first half-size local store being a half region of the local store, from a first half-size transfer unit region corresponding to the first half-size local store, the first half-size transfer unit region being a half region of the first transfer unit region;

after the first half-size upstream transfer, transferring data as a second half-size upstream transfer by using the DMA transfer mechanism to a second half-size local store being the half region other than the first half-size local store in the local store, from a second half-size transfer unit region being the half region other than the first half-size transfer unit region in the first transfer unit region;

testing the local store thereof includes the plurality of sub processors:

testing the first half-size local store regardless of the completion of the second half-size upstream transfer after the first half-size upstream transfer is completed, and testing the second half-size local store after the second half-size upstream transfer is completed;

transferring data as the subsequent upstream transfer includes each of the plurality of sub processors:

regardless of the completion of the test on the second half-size local store, after the test on the first half-size local store is completed, transferring data as a first subsequent half-size upstream transfer by using the DMA transfer mechanism, to the first half-size local store, from a first subsequent half-size transfer unit region, which is a half region of the subsequent transfer unit region and corresponds to the first half-size local store, and after the first further half-size upstream transfer, transferring data as a second subsequent half-size upstream transfer by using the DMA transfer mechanism, to the second half-size local store, from a second subsequent half-size transfer unit region being the half region other than the first subsequent half-size transfer unit region in the subsequent transfer unit region; and further testing the local store thereof includes each of the plurality of sub processors:

testing the first half-size local store regardless of the completion of the second subsequent half-size upstream transfer after the first further half-size upstream transfer is completed, and testing the second half-size local store after the second further half-size upstream transfer is completed.

5. The method of claim 3 further comprising:

repeating the shifting of the transfer destination and the subsequent downstream transfer, until transferring the initial data to the entire region of the partial memory region is complete.

6. A non-transitory computer program product including instructions for a main memory test, the computer program product configured for operation in a multi processor system including a main processor and a plurality of sub processors each having a DMA transfer mechanism and a local store and are capable of working in parallel with each other, the instructions configured to cause the multi processor system to perform operations comprising:

allocating a partial memory region in a test target region of the main memory to each of the plurality of sub processors;

requesting each of the plurality of sub processors to test the allocated partial main memory;

filling the local store of each of the plurality of sub processors with initial data in response to receiving the request;

transferring the filled initial data from the local store of each of the plurality of sub processors to the allocated partial memory region by using the DMA transfer mechanism;

transferring data from the partial memory region, which has received the filled initial data, to the local store of each of the plurality of sub processors by using the DMA transfer mechanism;

after the completion of transferring the data to the local store of each of the plurality of sub processors, testing the local store by checking if the value of the data in the local store which has received the data in the transfer from the partial memory region matches the value of the initial data, the testing including:

checking if a checksum value matches an expected checksum value calculated in advance from the initial data, by sequentially adding pieces of the data having been transferred to the local store to obtain a checksum, wherein each of the plurality of sub processors includes means for executing an M-byte SIMD Add instruction, and wherein calculating the checksum includes:

adding a first M-byte data and a second M-byte data byte by byte by using the SIMD Add instruction;

calculating a final M-byte addition data by repeating the adding through the entire region of the local store;

adding each byte of the final M-byte addition data;

in response to the completion of testing the local store for all the plurality of sub processors, judging a test result on the test target memory region of the main memory by putting together results of the tests on the respective local stores.

7. The non-transitory computer program product according to claim 6, wherein the testing the local store of each of the plurality of sub processors includes checking if a checksum value matches an expected checksum value calculated in advance from the initial data, by sequentially adding pieces of the data having been transferred to the local store by a predetermined unit to obtain a checksum.

8. A multi processor system for testing a main memory, comprising:

a main processor;

a plurality of sub processors each having a DMA transfer mechanism and a local store;

a main memory connected so as to be accessible from the main processor and the plurality of sub processors;

allocating means for allocating a partial memory region in a test target memory region of the main memory to each of the plurality of sub processors, the allocating means being included in the main processor;

test requesting means for requesting each of the plurality of sub processors to test the allocated partial memory region;

filling means for filling the local store with initial data in response to receiving the request, the filling means being included in each of the plurality of sub processors;

downstream transfer means for transferring the filled initial data from the local store to the partial memory region by using the DMA transfer mechanism, the downstream transfer means being included in each of the plurality of sub processors;

upstream transfer means for transferring data from the partial memory region, which has received the filled initial data, to the local store of the sub processor by using the DMA transfer mechanism, the upstream transfer means being included in each of the plurality of sub processors;

testing means for testing the local store by checking if the value of the data in the local store which has received the data in the transfer from the partial memory region matches and the value of the initial data, the testing means being included in each of the plurality of sub processors, wherein the testing means includes means for checking if a checksum value matches an expected checksum value calculated in advance from the initial data, by sequentially adding pieces of the data having been transferred to the local store to obtain a checksum, wherein each of the plurality of sub processors includes means for executing an M-byte SIMD Add instruction, and wherein the checksum is calculated by adding a first M-byte data and a second M-byte data byte by byte by using the SIMD Add instruction; calculating a final M-byte addition data by repeating the adding through the entire region of the local store;

adding each byte of the final M-byte addition data; and test judging means for judging a test result on the test target memory region of the main memory by putting together results of the tests on the respective local stores, in response to the completion of the tests on the local stores in all the plurality of respective sub processors, the test judging means being included in the main processor.

9. The multi processor system according to claim 8, wherein the testing means checks if a checksum value matches an expected checksum value calculated in advance from the initial data by sequentially adding pieces of the data having been transferred to the local store by a predetermined unit to obtain a checksum.

* * * * *